(12) United States Patent
Waidhas et al.

(10) Patent No.: US 10,403,602 B2
(45) Date of Patent: Sep. 3, 2019

(54) MONOLITHIC SILICON BRIDGE STACK INCLUDING A HYBRID BASEBAND DIE SUPPORTING PROCESSORS AND MEMORY

(71) Applicant: Intel Corporation, Santa Clara, CA (US)

(72) Inventors: Bernd Waidhas, Pettendorf (DE); Georg Seidemann, Landshut (DE); Andreas Augustin, Munich (DE); Laurent Millou, Munich (DE); Andreas Wolter, Regensburg (DE); Reinhard Mahnkopf, Oberhaching (DE); Stephan Stoeckl, Schwandorf (DE); Thomas Wagner, Regelsbach (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/637,935

(22) Filed: Jun. 29, 2017

(65) Prior Publication Data

US 2019/0006318 A1    Jan. 3, 2019

(51) Int. Cl.
| | | |
|---|---|---|
| H01L 21/48 | (2006.01) | |
| H01L 25/065 | (2006.01) | |
| H01L 23/48 | (2006.01) | |
| G06F 15/76 | (2006.01) | |
| H01L 25/00 | (2006.01) | |

(52) U.S. Cl.
CPC ........ *H01L 25/0657* (2013.01); *H01L 21/486* (2013.01); *H01L 23/481* (2013.01); *G06F 15/76* (2013.01); *H01L 25/50* (2013.01); *H01L 2224/16225* (2013.01)

(58) Field of Classification Search
None
See application file for complete search history.

(56) References Cited

U.S. PATENT DOCUMENTS

| | | | |
|---|---|---|---|
| 2008/0224298 A1* | 9/2008 | Corisis | H01L 23/49827 257/690 |
| 2012/0018895 A1* | 1/2012 | Oganesian | H01L 23/481 257/773 |
| 2014/0159231 A1* | 6/2014 | Lundberg | B82Y 10/00 257/737 |
| 2016/0155732 A1* | 6/2016 | Wu | H01L 21/486 438/108 |
| 2016/0372449 A1* | 12/2016 | Rusu | H01L 23/5227 |
| 2017/0084589 A1* | 3/2017 | Kuo | H01L 25/105 |
| 2017/0263518 A1* | 9/2017 | Yu | H01L 24/16 |
| 2018/0102298 A1* | 4/2018 | Chen | H01L 23/5383 |

FOREIGN PATENT DOCUMENTS

DE     102018112868     1/2019

* cited by examiner

*Primary Examiner* — Thao P Le
(74) *Attorney, Agent, or Firm* — Schwegman Lundberg & Woessner, P.A.

(57) ABSTRACT

A semiconductive device stack, includes a baseband processor die with an active surface and a backside surface, and a recess in the backside surface. A recess-seated device is disposed in the recess, and a through-silicon via in the baseband processor die couples the baseband processor die at the active surface to the recess-seated die at the recess. A processor die is disposed on the baseband processor die backside surface, and a memory die is disposed on the processor die. The several dice are coupled by through-silicon via groups.

9 Claims, 6 Drawing Sheets

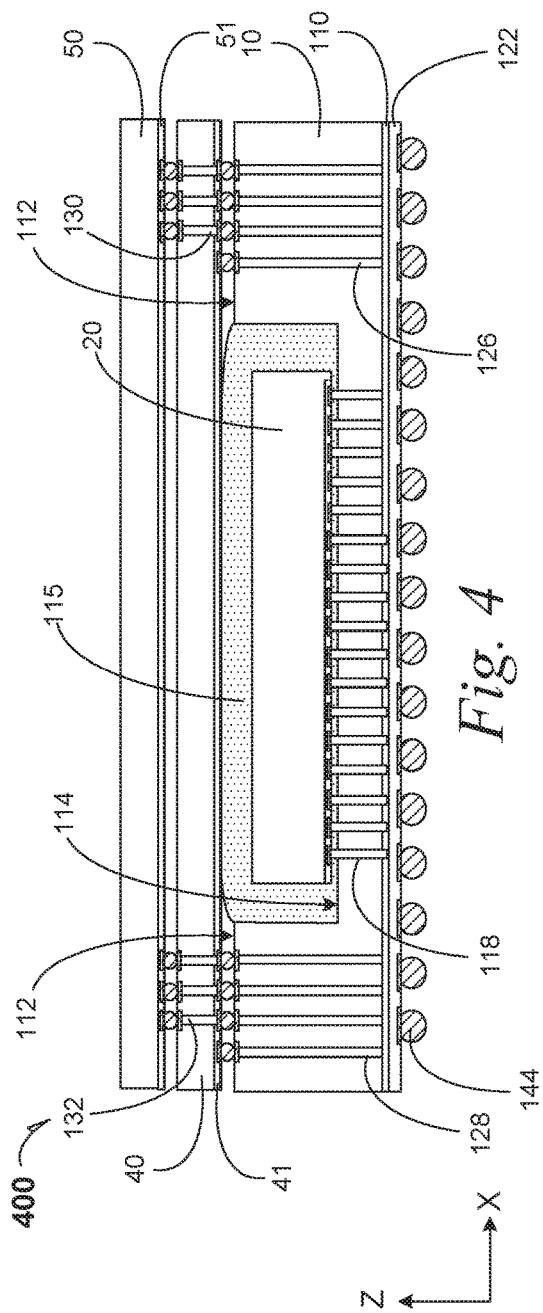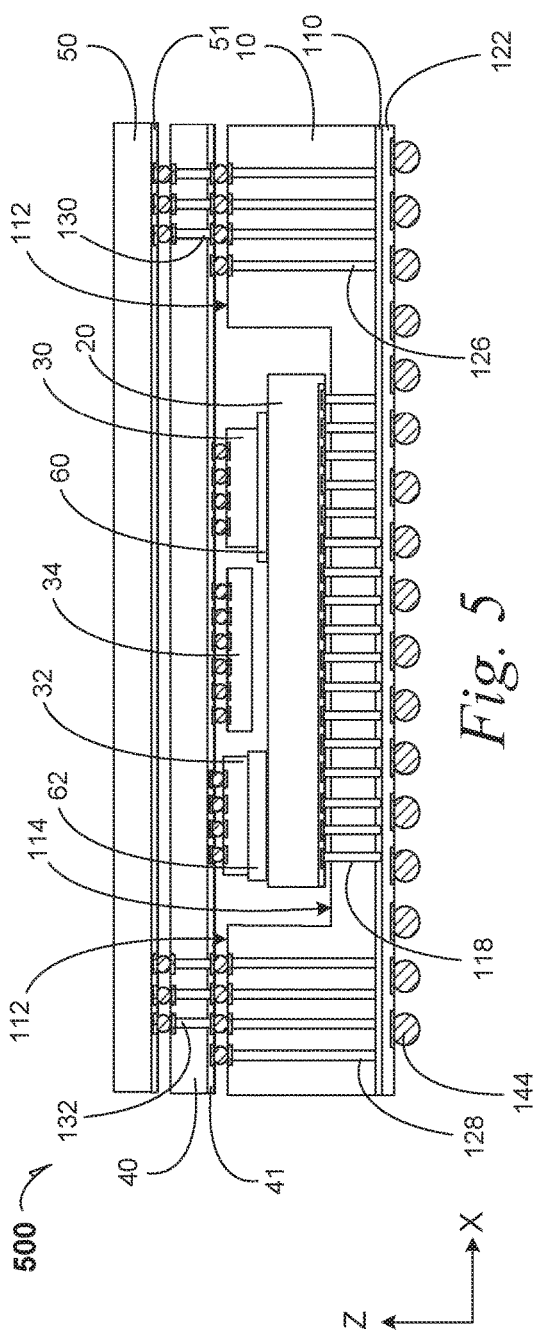

MONOLITHIC SILICON BRIDGE STACK INCLUDING A HYBRID BASEBAND DIE SUPPORTING PROCESSORS AND MEMORY

FIELD

This disclosure relates to semiconductive devices stacked upon a hybrid baseband die.

BACKGROUND

Semiconductive device miniaturization creates footprint challenges during assembly of several dice into a package as device and package sizes continually shrink.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 4 is a cross-section elevation of a monolithic silicon bridge stack according to an embodiment;

FIG. 5 is a cross-section elevation of a monolithic silicon bridge stack according to an embodiment;

DETAILED DESCRIPTION

Mobile telephones and wearable computing appliances require discrete device integration and high performance between devices as well as a complete computing and communications platform. A baseband processor and an application processor are stacked with a memory subsystem and drivers are applied to achieve high performance. The device stack appears monolithic as the baseband processor acts as both a substrate and a hybrid silicon bridge between at least one backside recess-seated device and a processor that is stacked on the baseband processor.

Figure 1:
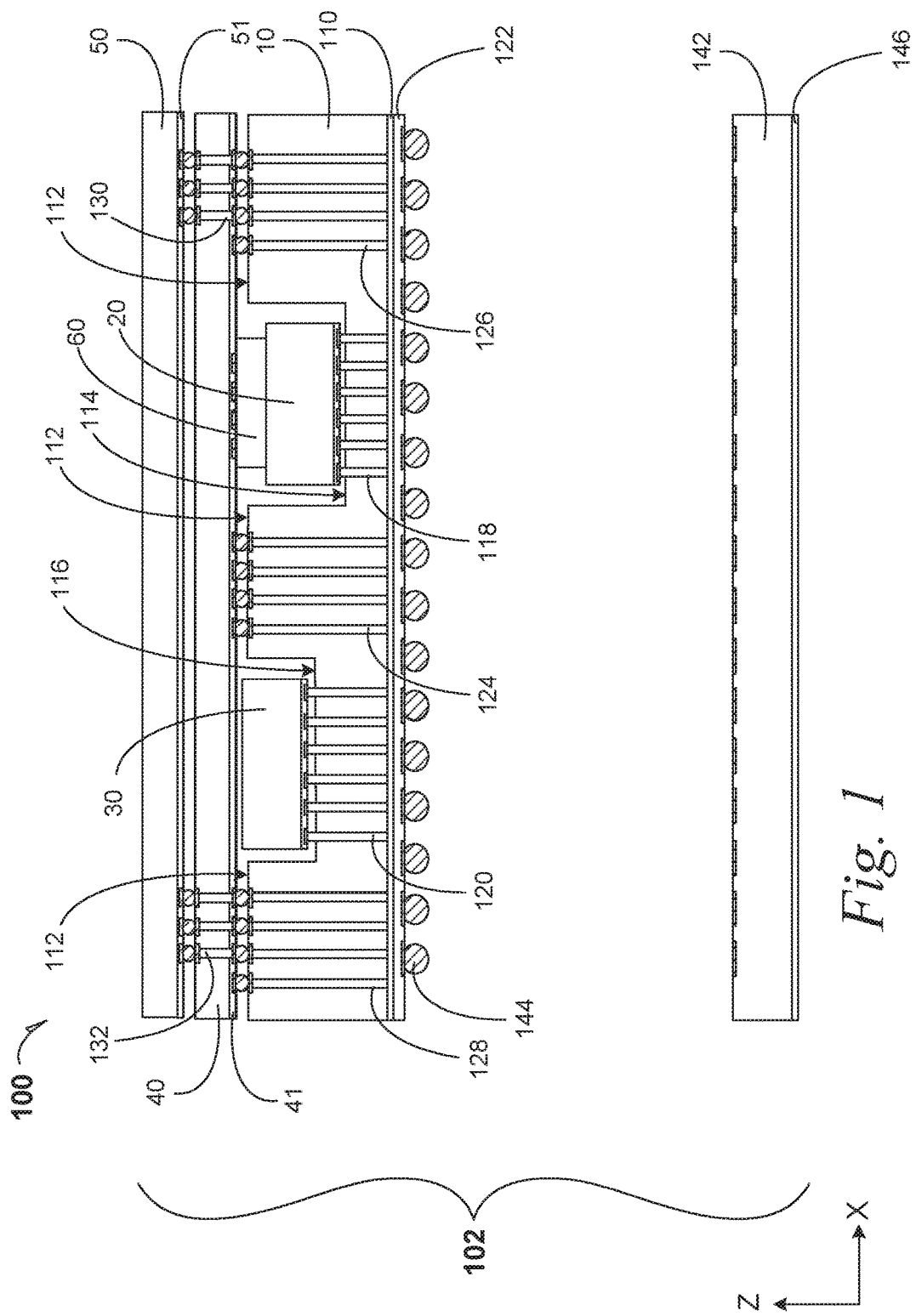
FIG. 1 is a cross-section elevation of a monolithic silicon bridge stack according to an embodiment.

FIG. 1 is a cross-section elevation of a monolithic silicon bridge stack 100 according to an embodiment. A baseband processor die 10 includes an active surface 110 and a backside surface 112. The active surface 110 includes active devices such as solid-state transistors and circuitry that supports baseband-processor function among other functions.

In an embodiment, a first recess 114 and a subsequent recess 116 are configured for a first recess-seated device 20 and a subsequent recess-seated device 30, respectively. In an embodiment, the first recess-seated device 20 is disposed in the first recess 114 and it is coupled to the active surface 110 of the baseband processor die 10 by a first through-silicon via (TSV) group 118. In an embodiment, a subsequent recess-seated device 30 is dispose in the subsequent recess 116 and it is also coupled to the active surface 110 of the baseband processor die 10 through a subsequent TSV group 120. In an embodiment, the first recess-seated device 20 is a power-management unit (PMU) 20. In an embodiment, the subsequent recess-seated device 30 is a transceiver 30.

In an embodiment, communication between the baseband processor die 10 and the first recess-seated device 20 is done through a redistribution layer (RDL) 122 that is disposed on the active surface 110 of the baseband processor die 10. Communication is accomplished by use of the first TSV group 118 where the RDL 122 provides a channel between the baseband processor die 10 and first recess-seated device 20.

In an embodiment, communication between the baseband processor die 10 and the subsequent recess-seated device 30 is done through the RDL 122 that is disposed on the active surface 110 of the baseband processor die 10. Communication is accomplished by use of the subsequent TSV group 120 where the RDL 122 provides a channel between the baseband processor die 10 and the subsequent recess-seated device 30. In an embodiment as illustrated the first TSV group 118 has a first Z-direction height that is not the same as the subsequent TSV group height 120. As illustrated in an embodiment, the first TSV group 118 has a first Z-direction height that is less than the subsequent TSV group height 120. In an embodiment opposite as illustrated, the first TSV group 118 has a first Z-direction height that is more than the subsequent TSV group 120 height.

It can now be understood that the baseband processor die 10 acts as a communications bridge 10 between the first recess-seated device 20 and the subsequent recess-seated device 30. In an embodiment, communication passes through the RDL 122. In an embodiment, communication passes through the active surface 110. In an embodiment, communication passes through both the active surface 110 and the RDL 122.

In an embodiment, a processor die 40 such as an application-specific integrated circuit (ASIC) 40 is mounted on the backside surface 112 of the baseband processor die 10. In an embodiment, the ASIC is a central-processing unit (CPU) that acts as the core computational function of the monolithic silicon bridge stack 100. In an embodiment, the X-direction footprint of the ASIC 40 is about the same as that of the baseband processor die 10. In an embodiment, the ASIC 40 has an active surface 41 that is face down as viewed in the drawing.

In an embodiment, communication between the ASIC 40 and the first recess-seated device 20 is done through the RDL 122 by use of the first TSV group 118 and at least one of a central TSV group 124 and a first lateral TSV group 126. In an embodiment, communication between the ASIC 40 and the first recess-seated device 20 is done through the active surface 110 and at least one of a central TSV group 124 and the first lateral TSV group 126.

In an embodiment, communication between the ASIC 40 and the subsequent recess-seated device 30 is done through the RDL 122 by use of the subsequent TSV group 120 and at least one of the central TSV group 124 and a subsequent lateral TSV group 128. In an embodiment, communication between the ASIC 40 and the subsequent recess-seated device 30 is done through the active surface 110 and at least one of the central TSV group 124 and the subsequent lateral TSV group 128.

In an embodiment, a memory die 50 such as a non-volatile memory device 50 is mounted on the ASIC 40 opposite the active surface 41. In an embodiment, memory device 50 has an X-direction footprint that is about the same as that of the baseband processor die 10. In an embodiment, the memory device 50 has an active surface 51 that is face down as viewed in the drawing. In an embodiment, the memory device 50 is a memory module with multiple memory dice in a package 50, and a memory controller hub is also part of the package 50.

In an embodiment, communication between the memory device 50 and the first recess-seated device 20 is done through the RDL 122 by use of the first TSV group 118 and at least one of the central TSV group 124, the first lateral TSV group 126, and a first ASIC TSV group 130. In an embodiment, communication between the memory device 50 and the first recess-seated device 20 is done through the active surface 110 and the first ASIC TSV group 130, and at least one of the central TSV group 124 and the first lateral TSV group 126.

In an embodiment, communication between the memory device 50 and the subsequent recess-seated device 30 is done through the RDL 122 by use of the subsequent TSV group 120 and at least one of the central TSV group 124 the subsequent lateral TSV group 128, and a subsequent ASIC TSV group 132. In an embodiment, communication between the memory device 50 and the subsequent recess-seated device 30 is done through the active surface 110 and the subsequent ASIC TSV group 132, and at least one of the central TSV group 124 and the subsequent lateral TSV group 128.

In an embodiment, a recess-stacked device 60 is disposed on a backside surface of the first recess-seated device 20. In an embodiment, the recess-stacked device 60 is a cooling device 140 such as a heat slug 140 or a heat pipe 140. In an embodiment, the recess-stacked device 60 is an active device such as a power-management unit (PMU) 60.

In an embodiment, the monolithic silicon bridge stack 100 is coupled with a package substrate 142 by a series of electrical bumps, one of which is indicated with reference number 144. In an embodiment, the series of electrical bumps 144 is an electrical-bump array such as a ball-grid array. A packaged monolithic silicon bridge stack 102 includes the package substrate 142. In an embodiment, the package substrate 142 includes an outer shell 146 that acts as an electrically insulative barrier for the packaged devices, as well as a physical barrier.

Figure 1A:
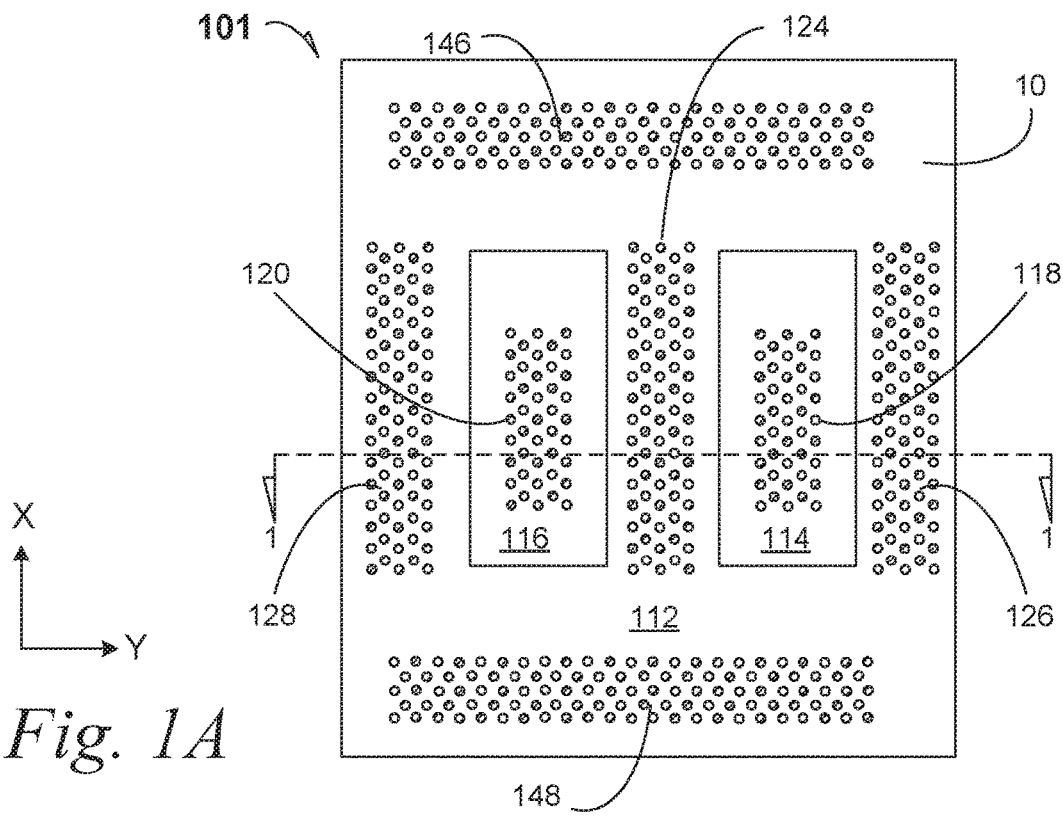
FIG. 1A is a top plan of the baseband processor die depicted in FIG. 1 according to an embodiment.

FIG. 1A is a top plan 101 of the baseband processor die 10 depicted in FIG. 1 according to an embodiment. The cross-section view of the baseband processor die 10 depicted in FIG. 1 may be seen along the section line 1-1.

The baseband processor die 10 shows the backside surface 112 as well as the first recess 114 and the subsequent recess 116. Further, the first TSV group 118 and the subsequent TSV group 120 are also exposed within the respective first recess 114 and subsequent recess 116. Further, the first lateral TSV group 126 and the subsequent lateral TSV group 128 are seen emerging at the backside surface 112.

In an embodiment, additional TSV groups 146 and 148, or one of them, is included in the baseband processor die 10.

Reference is made to FIG. 1. In an embodiment, the baseband processor die 10 includes several TSV groups and the memory die 50 is commonly shared by the baseband processor die 10 and the ASIC 40. The transceiver 30 addresses radio-frequency (RF) communication, and the ASIC addresses display and camera functions. This monolithic silicon bridge stack 100 creates a footprint that does not exceed that of the ASIC 40 in an embodiment. Further the several TSV groups allow for straight-through communication and power/ground contacts that minimize contact distances as well as inductive looping. A shortened communication length also reduces the resistive heating effect of longer contacts and traces.

In an embodiment, the baseband processor die 10 and the ASIC 40 share a common memory controller hub (MCH) function due to the several TSV groups that interconnect the two. This embodiment eliminates the need for a dedicated MCH in the baseband processor die 10. In an embodiment, the MCH is part of the baseband processor die 10. In an embodiment, the MCH is part of the ASIC 40.

In an embodiment, the subsequent TSV group 120 creates a sufficient short distance between the baseband processor die 10 and the transceiver 30 that a lowered frequency and a lowered voltage are required between the two. For example, a driver for operation between any two devices can operate at 0.7 Volt as opposed to 1.8 Volt or even 1.2 Volt.

In an embodiment, a given device in the monolithic silicon bridge stack 100 is made with an older technology node, but it is incorporated with a device made by a newer technology node. In such an embodiment, the RDL 122 provides sufficient pitch translation between devices to accommodate the different technology nodes.

In an embodiment, processing to open the first recess 114 and the subsequent recess 116 is accomplished by an etch chemistry. Processing includes masking the backside surface 112 that exposes the footprint of at least one of the first recess 114 and the subsequent recess 116. In an embodiment, a wet etch is carried out to open a recess. In an embodiment, wet-etch chemistry finds the given TSV group, and etching stops due to chemical interaction with the TSVs. In an embodiment, a directional dry etch is carried out through a mask on the backside surface 112, and etching stops at the selected level of a given TSV group.

Figure 2A:
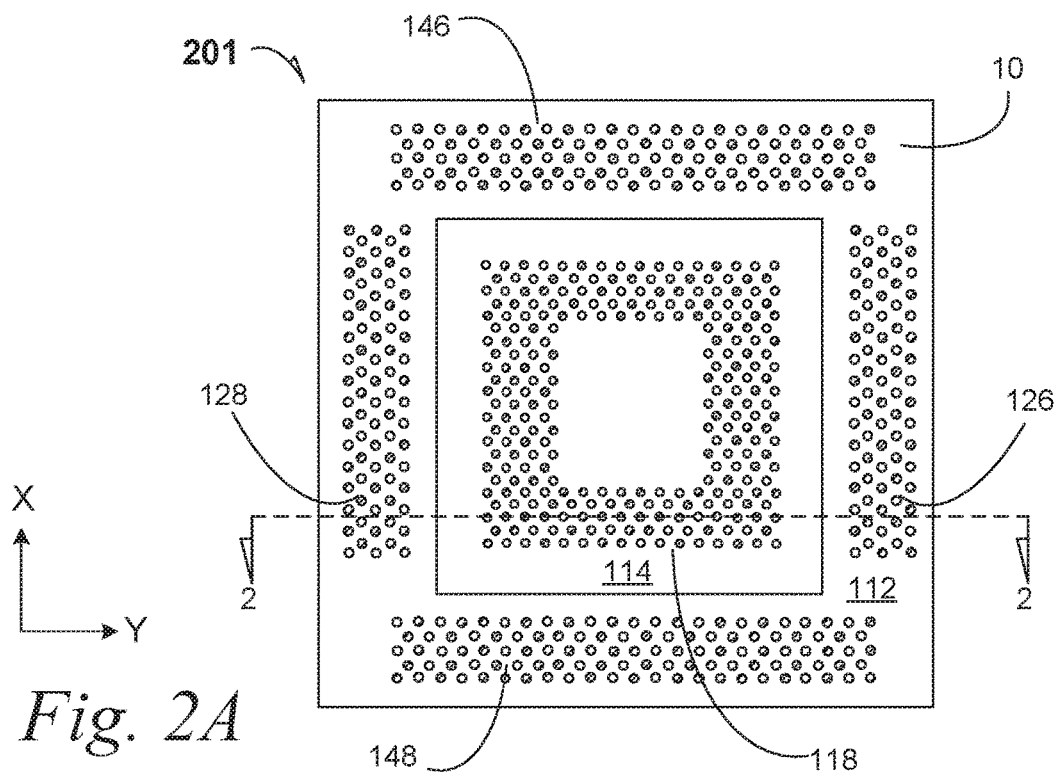
FIG. 2A is a top plan of the baseband processor die depicted in FIG. 2 according to an embodiment.
Figure 2:
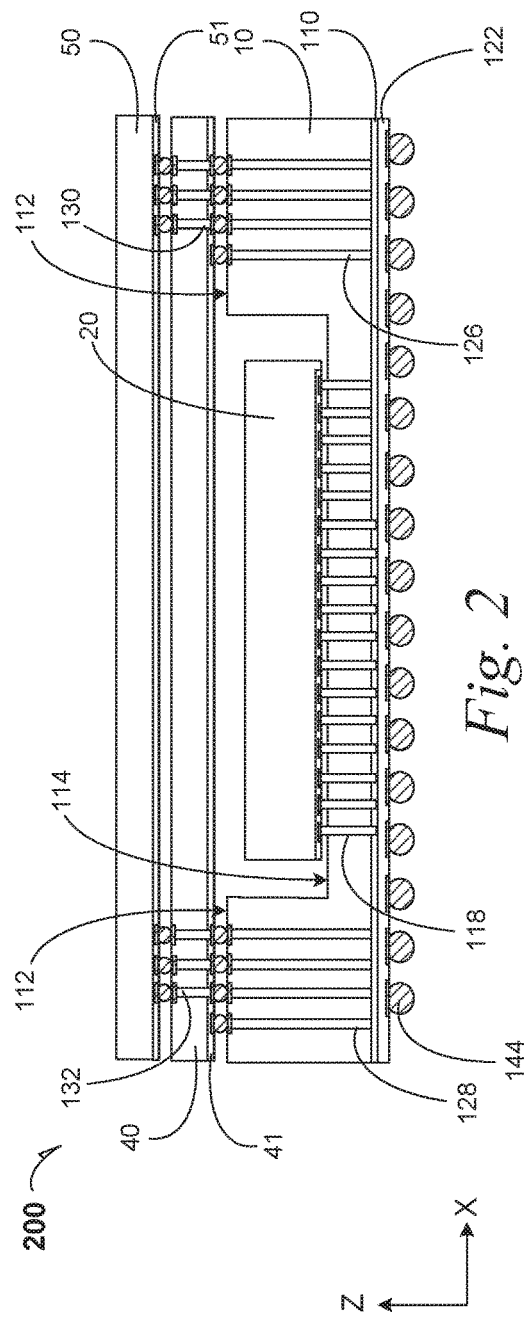
FIG. 2 is a cross-section elevation of a monolithic silicon bridge stack according to an embodiment.

FIG. 2 is a cross-section elevation of a monolithic silicon bridge stack 200 according to an embodiment. A baseband processor die 10 includes an active surface 110 and a backside surface 112. The active surface 110 includes active devices such as solid-state transistors and circuitry that supports baseband-processor function among other functions.

In an embodiment, a first recess 114 is configured for a first recess-seated device 20. In an embodiment, the first recess-seated device 20 is disposed in the first recess 114 and it is coupled to the active surface 110 of the baseband processor die 10 by a first through-silicon via (TSV) group 118. In an embodiment, the first recess-seated device 20 is a transceiver 20.

In an embodiment, communication between the baseband processor die 10 and the first recess-seated device 20 is done through a redistribution layer (RDL) 122 that is disposed on the active surface 110 of the baseband processor die 10. In an embodiment, communication is accomplished by use of the first TSV group 118 where the RDL 122 provides a channel between the baseband processor die 10 and first recess-seated device 20.

It can now be understood that the first TSV group 118 acts as a communications conduit between the first recess-seated device 20 and the baseband processor die 10. In an embodiment, communication passes through the RDL 122. In an embodiment, communication passes through the active surface 110. In an embodiment, communication passes through both the active surface 110 and the RDL 122.

In an embodiment, a processor die 40 such as a baseband core and a memory driver 40 is mounted on the backside surface 112 of the baseband processor die 10. In an embodiment, the processor die 40 is a central-processing unit (CPU) that acts as the core computational function of the monolithic silicon bridge stack 100, as well as the baseband core and memory driver. In an embodiment, the X-direction footprint of the processor 40 is about the same as that of the baseband processor die 10. In an embodiment, the processor 40 has an active surface 41 that is face down as viewed in the drawing.

Communication between the processor 40 and the first recess-seated device 20 is done through the RDL 122 by use of the first TSV group 118 a first lateral TSV group 126. In an embodiment, communication between the processor 40 and the first recess-seated device 20 is done through the active surface 110 and at least one of the central TSV group 124, and a subsequent lateral TSV group 128.

In an embodiment, a memory die 50 such as a non-volatile memory device 50 is mounted on the processor 40 opposite the active surface 41. In an embodiment, memory device 50 has an X-direction footprint that is about the same as that of the baseband processor die 10. In an embodiment, the memory device 50 has an active surface 51 that is face down as viewed in the drawing.

In an embodiment, communication between the memory device 50 and the first recess-seated device 20 is done through the RDL 122 by use of the first TSV group 118 and at least one of the first lateral TSV group 126, and a first processor TSV group 130. In an embodiment, communication between the memory device 50 and the first recess-seated device 20 is done through the active surface 110 and at least one of the subsequent lateral TSV group 128, and a subsequent processor TSV group 132.

In the illustrated embodiment, the baseband processing function is split into parts that are shared by the baseband processor die 10 and the processor 40. Stacking the processor 40 onto the baseband processor die 10 reduces the X-Y footprint. Stacking the processor 40 onto the baseband processor die 10 reduces contact lengths. Further, a bandwidth is increased between the transceiver 20 and the baseband processor die 10.

FIG. 2A is a top plan 201 of the baseband processor die 10 depicted in FIG. 2 according to an embodiment. The cross-section view of the baseband processor die 10 depicted in FIG. 2 may be seen along the section line 2-2.

The baseband processor die 10 shows the backside surface 112 as well as the first recess 114. Further, the first TSV group 118 is also exposed within the first recess 114. Further, the first lateral TSV group 126 and the subsequent lateral TSV group 128 are seen emerging at the backside surface 112.

In an embodiment, additional TSV groups 146 and 148, or one of them, is included in the baseband processor die 10.

Figure 3:
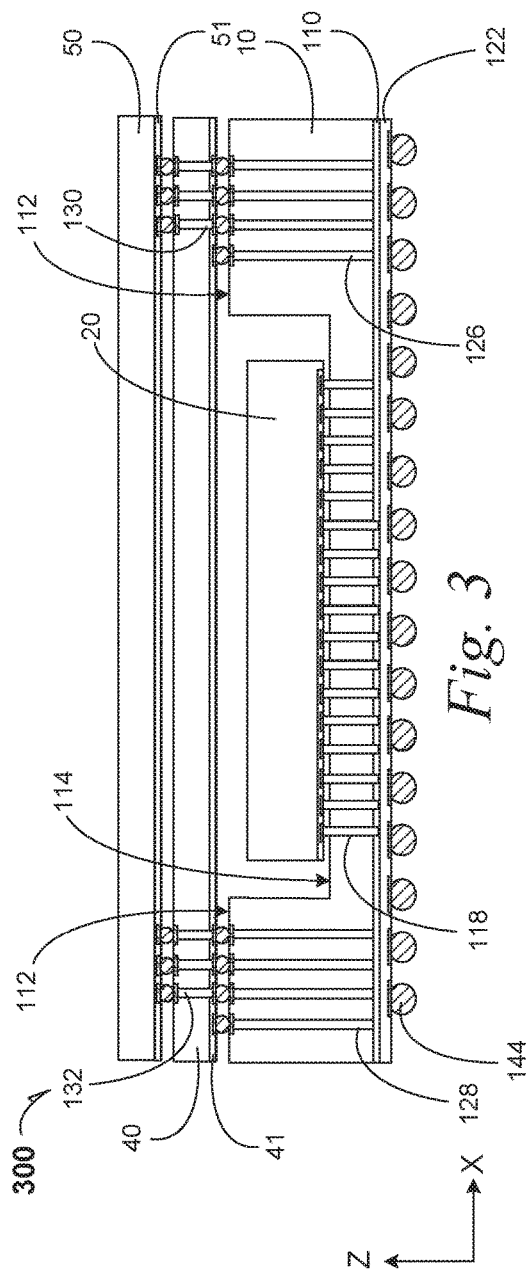
FIG. 3 is a cross-section elevation of a monolithic silicon bridge stack according to an embodiment.

FIG. 3 is a cross-section elevation of a monolithic silicon bridge stack 300 according to an embodiment. A baseband processor die 10 includes an active surface 110 and a backside surface 112. The active surface 110 includes active devices such as solid-state transistors and circuitry that supports baseband-processor function among other functions.

In an embodiment, a first recess 114 is configured for a first recess-seated device 20. In an embodiment, the first recess-seated device 20 is disposed in the first recess 114 and it is coupled to the active surface 110 of the baseband processor die 10 by a first through-silicon via (TSV) group 118. In an embodiment, the first recess-seated device 20 is a transceiver 20.

In an embodiment, communication between the baseband processor die 10 and the first recess-seated device 20 is done through a redistribution layer (RDL) 122 that is disposed on the active surface 110 of the baseband processor die 10. In an embodiment, communication is accomplished by use of the first TSV group 118 where the RDL 122 provides a channel between the baseband processor die 10 and first recess-seated device 20.

It can now be understood that the first TSV group 118 acts as a communications conduit between the first recess-seated device 20 and the baseband processor die 10. In an embodiment, communication passes through the RDL 122. In an embodiment, communication passes through the active surface 110. In an embodiment, communication passes through both the active surface 110 and the RDL 122.

In an embodiment, a processor die 40 such as an application-specific integrated circuit (ASIC) and a memory driver 40 is mounted on the backside surface 112 of the baseband processor die 10. In an embodiment, the processor die 40 is a central-processing unit (CPU) that acts as the core computational function of the monolithic silicon bridge stack 100, as well as the ASIC core and memory driver 40. In an embodiment, the X-direction footprint of the ASIC and memory driver 40 is about the same as that of the baseband processor die 10. In an embodiment, the ASIC and memory driver 40 has an active surface 41 that is face down as viewed in the drawing.

In an embodiment, communication between the ASIC and memory driver 40 and the first recess-seated device 20 is done through the RDL 122 by use of the first TSV group 118 a first lateral TSV group 126. In an embodiment, communication between the ASIC and memory driver 40 and the first recess-seated device 20 is done through the active surface 110 and at least one of the central TSV group 124 and a subsequent lateral TSV group 128.

In an embodiment, a memory die 50 such as a non-volatile memory device 50 is mounted on the ASIC and memory driver 40 opposite the active surface 41. In an embodiment, memory device 50 has an X-direction footprint that is about the same as that of the baseband processor die 10. In an embodiment, the memory device 50 has an active surface 51 that is face down as viewed in the drawing.

In an embodiment, communication between the memory device 50 and the first recess-seated device 20 is done through the RDL 122 by use of the first TSV group 118 and at least one of the first lateral TSV group 126, and a first processor TSV group 130. In an embodiment, communication between the memory device 50 and the first recess-seated device 20 is done through the active surface 110 and at least one of the subsequent lateral TSV group 128, and a subsequent processor TSV group 132.

Stacking the ASIC and memory driver 40 onto the baseband processor die 10 reduces the X-Y footprint. Stacking the ASIC and memory driver 40 onto the baseband processor die 10 reduces contact lengths. Further, a bandwidth is increased between the transceiver 20 and the baseband processor die 10.

FIG. 4 is a cross-section elevation of a monolithic silicon bridge stack 400 according to an embodiment. A baseband processor die 10 includes an active surface 110 and a backside surface 112. The active surface 110 includes active devices such as solid-state transistors and circuitry that supports baseband-processor function among other functions.

In an embodiment, a first recess 114 is configured for a first recess-seated device 20. In an embodiment, the first recess-seated device 20 is disposed in the first recess 114 and it is coupled to the active surface 110 of the baseband processor die 10 by a first through-silicon via (TSV) group 118. In an embodiment, the first recess-seated device 20 is a transceiver 20.

Communication between the baseband processor die 10 and the first recess-seated device 20 is done through a redistribution layer (RDL) 122 that is disposed on the active surface 110 of the baseband processor die 10. Communication is accomplished by use of the first TSV group 118 where the RDL 122 provides a channel between the baseband processor die 10 and first recess-seated device 20.

It can now be understood that the first TSV group 118 acts as a communications conduit between the first recess-seated device 20 and the baseband processor die 10. In an embodiment, communication passes through the RDL 122. In an embodiment, communication passes through the active surface 110. In an embodiment, communication passes through both the active surface 110 and the RDL 122.

In an embodiment, a processor die 40 such as a multi-core processor die that includes imaging logic and a memory driver 40 is mounted on the backside surface 112 of the baseband processor die 10. In an embodiment, the processor die 40 is a central-processing unit (CPU) that acts as the core computational function of the monolithic silicon bridge stack 100, as well as the multi-core, imaging logic and memory driver 40. In an embodiment, the X-direction footprint of the multi-core, imaging logic and memory driver 40 is about the same as that of the baseband processor die 10. In an embodiment, the multi-core, imaging logic and memory driver 40 has an active surface 41 that is face down as viewed in the drawing.

Communication between the multi-core, imaging logic and memory driver 40 and the first recess-seated device 20 is done through the RDL 122 by use of the first TSV group 118 a first lateral TSV group 126. In an embodiment, communication between the multi-core, imaging logic and memory driver 40 and the first recess-seated device 20 is done through the active surface 110 and at least one of the central TSV group 124 and a subsequent lateral TSV group 128.

In an embodiment, a memory die 50 such as a non-volatile memory device 50 is mounted on the multi-core, imaging logic and memory driver 40 opposite the active surface 41. In an embodiment, the memory device 50 has an X-direction footprint that is about the same as that of the baseband processor die 10. In an embodiment, the memory device 50 has an active surface 51 that is face down as viewed in the drawing.

In an embodiment, communication between the memory device 50 and the first recess-seated device 20 is done through the RDL 122 by use of the first TSV group 118 and at least one of the first lateral TSV group 126, and a first processor TSV group 130. In an embodiment, communication between the memory device 50 and the first recess-seated device 20 is done through the active surface 110 and at least one of the subsequent lateral TSV group 128, and a subsequent processor TSV group 132.

Stacking the multi-core, imaging logic and memory driver 40 onto the baseband processor die 10 reduces the X-Y footprint. Stacking the multi-core, imaging logic and memory driver 40 onto the baseband processor die 10 reduces contact lengths. Further, a bandwidth is increased between the transceiver 20 and the baseband processor die 10.

In an embodiment, an underfill material 115 is filled into the first recess 114 such that the transceiver 20 has been protected and at least partially encapsulated. In an embodiment, the underfill material 115 includes fillers that have coefficients of thermal expansion (CTEs) that approach the CTE of the semiconductive materials of both the baseband processor die 10 and the transceiver 20. In an embodiment, the underfill material 115 includes a silicon-containing material such as a siloxane polymer. It may now be understood that an underfill material such as the underfill material 115 embodiments may be added to any recess embodiment in this disclosure.

FIG. 5 is a cross-section elevation of a monolithic silicon bridge stack 500 according to an embodiment. A baseband processor die 10 includes an active surface 110 and a backside surface 112. The active surface 110 includes active devices such as solid-state transistors and circuitry that supports baseband-processor function among other functions.

In an embodiment, a first recess 114 is configured for a first recess-seated device 20. In an embodiment, a first recess-stacked device 30 is stacked upon the first recess-seated device 20. The first recess-stacked device 30 is disposed above the first recess-seated device 20 with a spacer 60 that allows the active surface of the first recess-stacked device 30 to be about the same Z-direction height as the backside surface 112 of the baseband processor die 10. In an embodiment, the spacer 60 is an adhesive. In an embodiment, the spacer 60 is a heat slug. In an embodiment, the spacer 60 is a passive device such as a capacitor, an inductor, or a resistor.

In an embodiment, a subsequent recess-stacked device 32 is stacked upon the first recess-seated device 20. The subsequent recess-stacked device 32 is disposed above the first recess-seated device 20 with a spacer 62 that allows the active surface of the subsequent recess-stacked device 32 to be about the same Z-direction height as the backside surface 112 of the baseband processor die 10. In an embodiment, the spacer 62 is an adhesive. In an embodiment, the spacer 62 is a heat slug. In an embodiment, the spacer 62 is a passive device such as a capacitor, an inductor, or a resistor.

In an embodiment, the first recess-seated device 20 is disposed in the first recess 114 and it is coupled to the active surface 110 of the baseband processor die 10 by a first through-silicon via (TSV) group 118.

In an embodiment, a processor die 40 such as an application-specific integrated circuit (ASIC) 40 is mounted on the backside surface 112 of the baseband processor die 10. In an embodiment, a recess-suspended device 34 is attached to the processor die 40 in a face-to-face configuration. It can now be appreciated that the three devices 30, 32 and 34 may be placed in the X-Y plane with respect to the processor die 40 in usefully proximity to circuitry within the processor die 40 for at least one of higher speed, lower resistive heat effect and assembly yield.

In an embodiment, the subsequent recess-seated device 30 is stacked on the first recess-seated device 20 and it is coupled to the active surface 41 of the processor 40. In an embodiment, the first recess-seated device 20 is a power-management unit transceiver 20. In an embodiment, the subsequent recess-seated device 30 is a power-management unit (PMU) 30.

Communication between the baseband processor die 10 and the first recess-seated device 20 is done through the processor 40.

In an embodiment, a memory die 50 such as a non-volatile memory device 50 is mounted on the processor 40 opposite the active surface 41. In an embodiment, memory device 50 has an X-direction footprint that is about the same as that of the baseband processor die 10. In an embodiment, the memory die 50 has an active surface 51 that is face down as viewed in the drawing.

In an embodiment, communication between the memory device 50 and the first recess-seated device 20 is done by use of a first processor TSV group 130.

Figure 6:
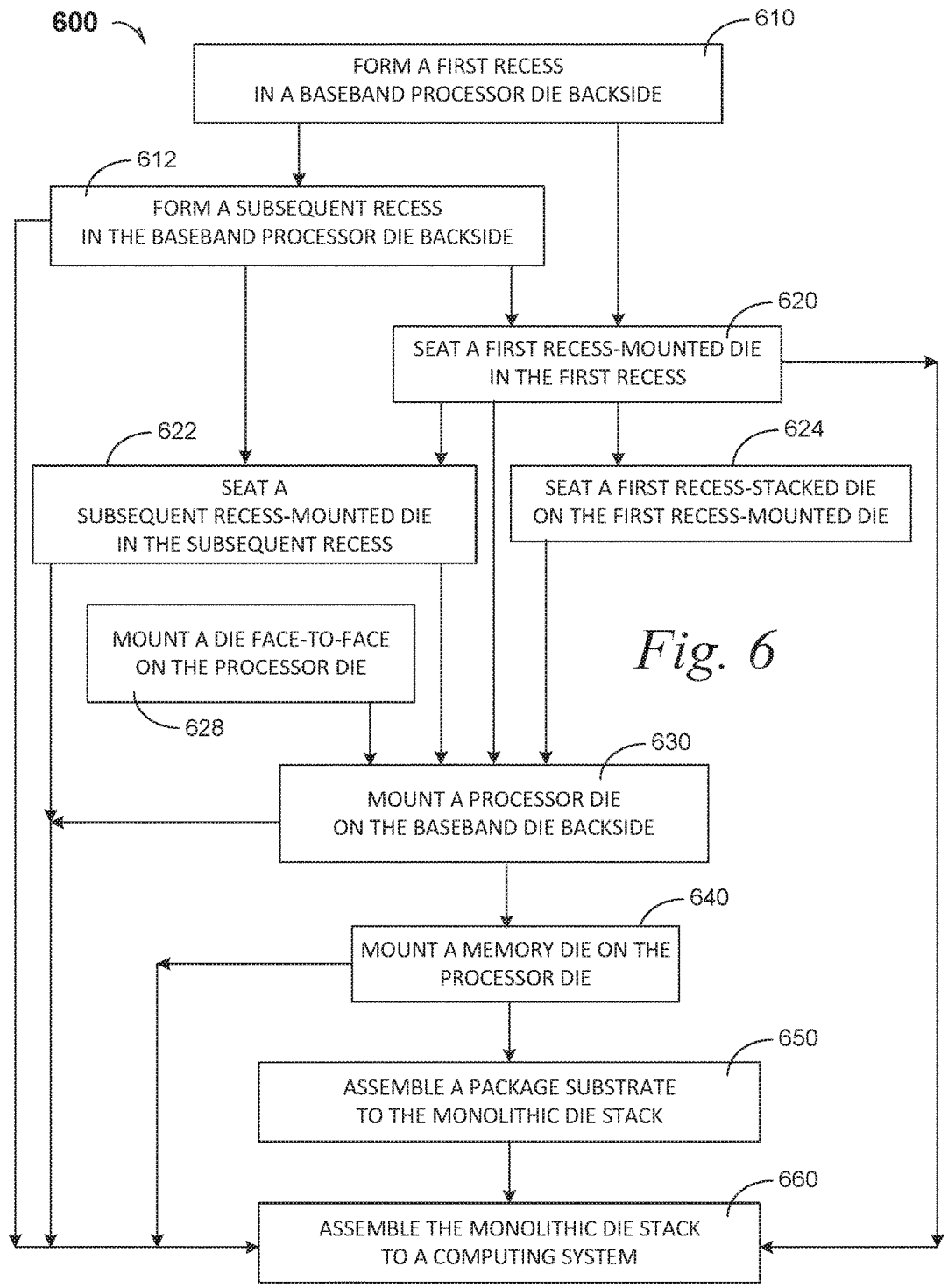
FIG. 6 is a process flow diagram 600 according to several embodiments.

FIG. 6 is a process flow diagram 600 according to several embodiments.

At 610, the process includes forming a first recess in a baseband processor die backside. In a non-limiting example embodiment, a recess is formed by wet etching. In a non-limiting example embodiment, a recess is formed by reactive-ion etching (RIE). In a non-limiting example embodiment, a recess is formed by a combination of wet- and reactive-ion etching.

At 612, the process includes forming a subsequent recess in the baseband processor die backside.

At 620, the process includes seating a first recess-seated die in the first recess.

At 622, the process includes seating a subsequent recess-seated die in the subsequent recess.

At 624, the process includes seating a first recess-stacked die on the first recess-seated die.

At 630, the process includes mounting a processor die on the baseband processor die backside surface.

At 628, the process includes mounting a die face-to-face on the processor die.

At 640, the process includes mounting a memory die on the processor die.

At 650, the process includes assembling a package substrate to the monolithic silicon bridge die stack.

At 660, the process includes assembling the monolithic silicon bridge die stack to a computing system.

Figure 7:
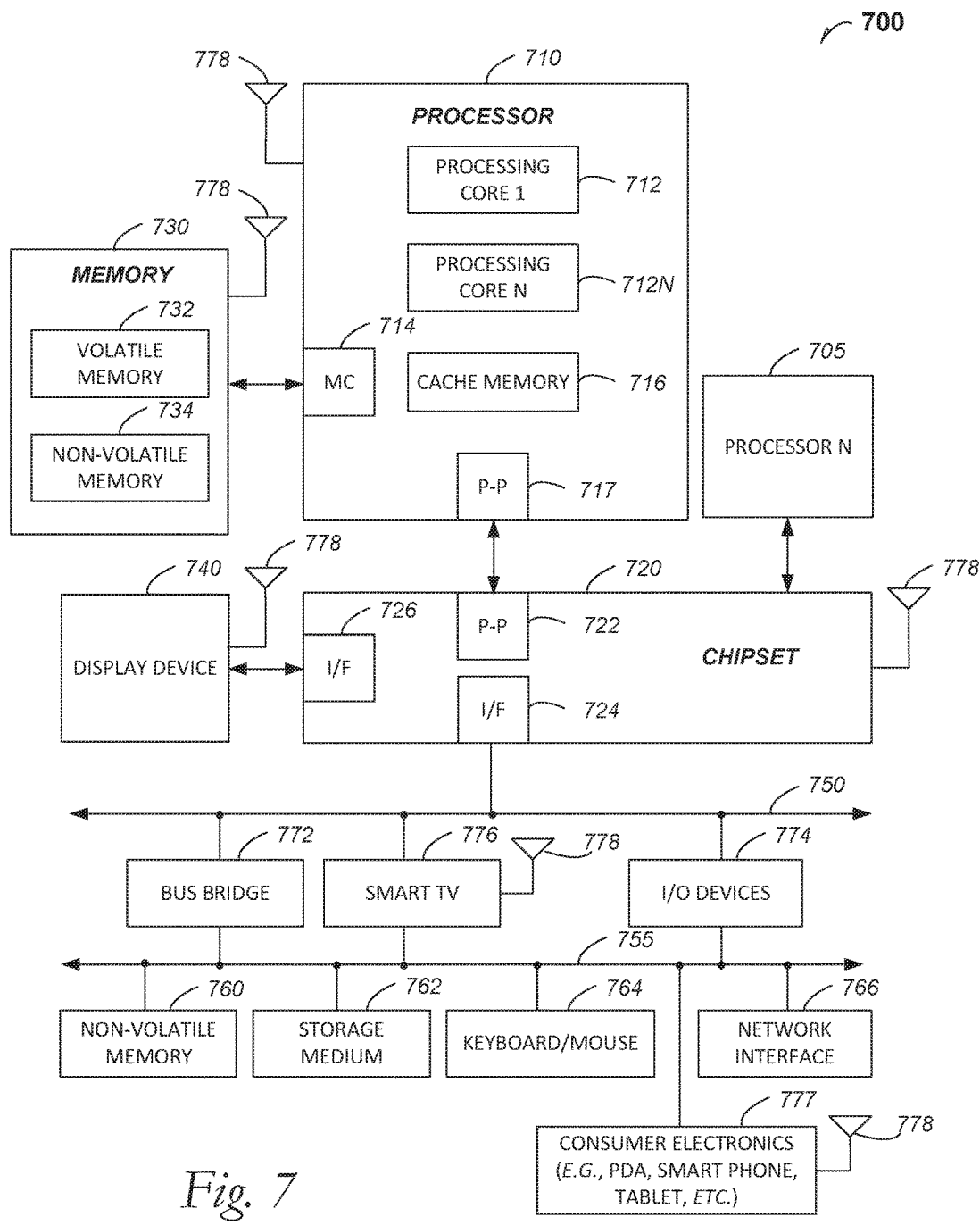
FIG. 7 is included to show an example of a higher level device application for the disclosed embodiments.

FIG. 7 is included to show an example of a higher level device application for the disclosed embodiments. The monolithic silicon bridge die stack embodiments may be found in several parts of a computing system. In an embodiment, a computing system 700 includes, but is not limited to, a desktop computer. In an embodiment, a system 700 includes, but is not limited to a laptop computer. In an embodiment, a system 700 includes, but is not limited to a netbook. In an embodiment, a system 700 includes, but is not limited to a tablet. In an embodiment, a system 700 includes, but is not limited to a notebook computer. In an embodiment, a system 700 includes, but is not limited to a personal digital assistant (PDA). In an embodiment, a system 700 includes, but is not limited to a server. In an embodiment, a system 700 includes, but is not limited to a workstation. In an embodiment, a system 700 includes, but is not limited to a cellular telephone. In an embodiment, a system 700 includes, but is not limited to a mobile computing device. In an embodiment, a system 700 includes, but is not limited to a smart phone. In an embodiment, a system 700 includes, but is not limited to an internet appliance. In an embodiment, the monolithic silicon bridge die stack is part of a wearable computing system. Other types of computing device may be configured with the microelectronic device that includes monolithic silicon bridge die stack embodiments.

In an embodiment, the processor 710 has one or more processing cores 712 and 712N, where 712N represents the Nth processor core inside processor 710 where N is a positive integer. In an embodiment, the electronic device system 700 using a monolithic silicon bridge die stack embodiment that includes multiple processors including 710 and 705, where the processor 705 has logic similar or identical to the logic of the processor 710. In an embodiment, the processing core 712 includes, but is not limited to, pre-fetch logic to fetch instructions, decode logic to decode the instructions, execution logic to execute instructions and the like. In an embodiment, the processor 710 has a cache memory 716 to cache at least one of instructions and data for the monolithic silicon bridge die stack in the system 700. The cache memory 716 may be organized into a hierarchal structure including one or more levels of cache memory.

In an embodiment, the processor 710 includes a memory controller 714, which is operable to perform functions that enable the processor 710 to access and communicate with memory 730 that includes at least one of a volatile memory 732 and a non-volatile memory 734. In an embodiment, the processor 710 is coupled with memory 730 and chipset 720. The processor 710 may also be coupled to a wireless antenna 778 to communicate with any device configured to at least one of transmit and receive wireless signals. In an embodiment, the wireless antenna interface 778 operates in accordance with, but is not limited to, the IEEE 802.11 standard and its related family, Home Plug AV (HPAV), Ultra Wide Band (UWB), Bluetooth, WiMax. or any form of wireless communication protocol.

In an embodiment, the volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 734 includes, but is not limited to, flash memory, phase change memory (PCM), read-only memory (ROM), electrically erasable programmable read-only memory (EEPROM), or any other type of non-volatile memory device.

The memory 730 stores information and instructions to be executed by the processor 710. In an embodiment, the memory 730 may also store temporary variables or other intermediate information while the processor 710 is executing instructions. In the illustrated embodiment, the chipset 720 connects with processor 710 via Point-to-Point (PtP or P-P) interfaces 717 and 722. Either of these PtP embodiments may be achieved using a monolithic silicon bridge die stack embodiment as set forth in this disclosure. The chipset 720 enables the processor 710 to connect to other elements in the monolithic silicon bridge die stack embodiments in a system 700. In an embodiment, interfaces 717 and 722 operate in accordance with a PtP communication protocol such as the Intel® QuickPath Interconnect (QPI) or the like. In other embodiments, a different interconnect may be used.

In an embodiment, the chipset 720 is operable to communicate with the processor 710, 705N, the display device 740, and other devices 772, 776, 774, 760, 762, 764, 766, 777, etc. The chipset 720 may also be coupled to a wireless antenna 778 to communicate with any device configured to at least do one of transmit and receive wireless signals.

The chipset 720 connects to the display device 740 via the interface 726. The display 740 may be, for example, a liquid crystal display (LCD), a plasma display, cathode ray tube (CRT) display, or any other form of visual display device. In and embodiment, the processor 710 and the chipset 720 are merged into a monolithic silicon bridge die stack in a system. Additionally, the chipset 720 connects to one or more buses 750 and 755 that interconnect various elements 774, 760, 762, 764, and 766. Buses 750 and 755 may be interconnected together via a bus bridge 772 such as at least one monolithic silicon bridge die stack embodiment. In an embodiment, the chipset 720 couples with a non-volatile memory 760, a mass storage device(s) 762, a keyboard/mouse 764, and a network interface 766 by way of at least one of the interface 724 and 774, the smart TV 776, and the consumer electronics 777, etc.

In an embodiment, the mass storage device 762 includes, but is not limited to, a solid state drive, a hard disk drive, a universal serial bus flash memory drive, or any other form of computer data storage medium. In one embodiment, network interface 766 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the monolithic silicon bridge die stack embodiment in a computing system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into the processor core 712.

Where useful, the computing system 700 may have an outer shell. Referring to FIG. 1, the package substrate 142 is a mounting substrate for the electrical bump array 144, and the package substrate 142 is protected by a shell 146 that both electrically and physical insulates useful structures set forth in this disclosure.

To illustrate the monolithic silicon bridge die stack embodiments and methods disclosed herein, a non-limiting list of examples is provided herein:

Example 1 is a semiconductive device stack, comprising: a baseband processor die including an active surface and a backside surface; a recess disposed in the backside surface; recess-seated device disposed in the recess; and a through-silicon via (TSV) in the baseband processor die that couples the the recess-seated die at the recess.

In Example 2, the subject matter of Example 1 optionally includes a processor die disposed on the baseband processor die backside surface, wherein the processor die is coupled to the baseband die through the TSV.

In Example 3, the subject matter of any one or more of Examples 1-2 optionally include a processor die disposed on the baseband processor die backside surface, wherein the processor die is coupled to the baseband die through the TSV; and a memory die disposed on the processor die, wherein the processor die and the memory die communicate through a TSV in the processor die.

In Example 4, the subject matter of any one or more of Examples 1-3 optionally include a processor die disposed on the baseband processor die backside surface, wherein the processor die is coupled to the baseband die through the TSV; a memory die disposed on the processor die, wherein the processor die and the memory die communicate through a TSV in the processor die; a redistribution layer (RDL) disposed on the active surface; a ball-grid array disposed on the RDL; and a package substrate coupled to the ball-grid array.

In Example 5, the subject matter of Example 4 optionally includes wherein the recess is a first recess, wherein the TSV is part of a first TSV group, further including: a subsequent recess disposed in the backside surface; a subsequent recess-seated device disposed in the subsequent recess; and a subsequent TSV group in the baseband processor die that couples the baseband processor die at the active surface to the subsequent recess-seated die at the subsequent recess.

In Example 6, the subject matter of any one or more of Examples 4-5 optionally include wherein the recess is a first recess, wherein the TSV is part of a first TSV group, further including: a redistribution layer (RDL) disposed on the active surface; a subsequent recess disposed in the backside surface; a subsequent recess-seated device disposed in the subsequent recess; a subsequent TSV group in the baseband processor die that couples the baseband processor die at the active surface to the subsequent recess-seated die at the subsequent recess; a ball-grid array disposed on the RDL; and a package substrate coupled to the ball-grid array.

In Example 7, the subject matter of any one or more of Examples 1-6 optionally include a processor die disposed on the baseband processor die backside surface, wherein the processor die is coupled to the baseband die through the TSV; and wherein the TSV is part of a first TSV group, and wherein the processor die also is coupled to a first lateral TSV group that is disposed in the baseband processor die.

In Example 8, the subject matter of any one or more of Examples 1-7 optionally include a processor die disposed on the baseband processor die backside surface, wherein the processor die is coupled to the baseband die through the TSV; wherein the TSV is part of a first TSV group, and wherein the processor die also is coupled to a first lateral TSV group that is disposed in the baseband processor die; and a memory die disposed on the processor die, wherein the processor die and the memory die communicate through a TSV in the processor die.

In Example 9, the subject matter of any one or more of Examples 1-8 optionally include wherein the recess is a first recess, wherein the TSV is part of a first TSV group, further including: a subsequent recess disposed in the backside surface; a subsequent recess-seated device disposed in the subsequent recess; and a subsequent TSV group in the baseband processor die that couples the baseband processor die at the active surface to the subsequent recess-seated die at the subsequent recess.

In Example 10, the subject matter of any one or more of Examples 1-9 optionally include wherein the recess is a first recess, wherein the TSV is part of a first TSV group, further including: a subsequent recess disposed in the backside surface; a subsequent recess-seated device disposed in the subsequent recess; and a subsequent TSV group in the baseband processor die that couples the baseband processor die at the active surface to the subsequent recess-seated die at the subsequent recess, wherein the first TSV group has a first height, the subsequent TSV group has a subsequent height, and wherein the first height and subsequent height are not equal.

In Example 11, the subject matter of Example 10 optionally includes a processor die disposed on the baseband processor die backside surface, wherein the processor die is coupled to the baseband die through the TSV; and wherein the TSV is part of a first TSV group, and wherein the processor die also is coupled to a first lateral TSV group that is disposed in the baseband processor die.

In Example 12, the subject matter of any one or more of Examples 10-11 optionally include a processor die disposed on the baseband processor die backside surface, wherein the processor die is coupled to the baseband die through the TSV; wherein the TSV is part of a first TSV group, and wherein the processor die also is coupled to a first lateral TSV group that is disposed in the baseband processor die;

and a memory die disposed on the processor die, wherein the processor die and the memory die communicate through a TSV in the processor die.

In Example 13, the subject matter of any one or more of Examples 1-12 optionally include a processor die disposed on the baseband processor die backside surface, wherein the processor die is coupled to the baseband die through the TSV; wherein the TSV is part of a first TSV group, and wherein the processor die also is coupled to a first lateral TSV group that is disposed in the baseband processor die; and a die disposed in the recess, wherein the die is face-to-face mounted to the processor die.

In Example 14, the subject matter of any one or more of Examples 1-13 optionally include a processor die disposed on the baseband processor die backside surface, wherein the processor die is coupled to the baseband die through the TSV; wherein the TSV is part of a first TSV group, and wherein the processor die also is coupled to a first lateral TSV group that is disposed in the baseband processor die; a die disposed in the recess, wherein the die is face-to-face mounted to the processor die; and a memory die disposed on the processor die, wherein the processor die and the memory die communicate through a TSV in the processor die.

Example 15 is a process of forming a monolithic die stack, comprising: forming a first recess in a baseband processor die backside surface, wherein the baseband processor die includes an active surface opposite the die backside; seating a first recess-seated die in the first recess, wherein the first recess-seated die is coupled to the active surface by a through-silicon via (TSV); mounting a processor die on the baseband die backside surface, wherein the processor die is coupled to the active surface by a first lateral TSV; and mounting a memory die on the processor die, wherein the memory die is coupled to the processor die by a first processor die TSV.

In Example 16, the subject matter of Example 15 optionally includes assembling a redistribution layer (RDL) to the baseband processor die active surface.

In Example 17, the subject matter of any one or more of Examples 15-16 optionally include assembling a redistribution layer (RDL) to the baseband processor die active surface; assembling an electrical bump array to the RDL; and assembling a package substrate to the monolithic die stack.

In Example 18, the subject matter of any one or more of Examples 15-17 optionally include seating a first recess-stacked die on the first recess-seated die.

In Example 19, the subject matter of any one or more of Examples 15-18 optionally include forming a subsequent recess in the baseband processor die backside surface, wherein the subsequent recess and the first recess are separately formed through the baseband processor die backside surface; and seating a subsequent recess-seated die in the subsequent recess.

In Example 20, the subject matter of any one or more of Examples 15-19 optionally include seating a first recess-stacked die on the first recess-seated die.

In Example 21, the subject matter of any one or more of Examples 15-20 optionally include mounting a die face-to-face on the processor die.

In Example 22, the subject matter of any one or more of Examples 15-21, wherein forming the recess includes etching selected from the group consisting of reactive ion etching and wet etching.

Example 23 is a computing system using a semiconductive device stack, comprising: a baseband processor die including an active surface and a backside surface; a first recess disposed in the backside surface; first recess-seated device disposed in the first recess; and a through-silicon via (TSV) in the baseband processor die that couples the baseband processor die at the active surface to the recess-seated die at the recess; a redistribution layer (RDL) coupled to the active surface; an electrical bump array coupled to the RDL; a package substrate coupled to the electrical bump array; and a physical shell coupled to the package substrate.

In Example 24, the subject matter of Example 23 optionally includes a processor die disposed on the baseband processor die backside surface, wherein the processor die is coupled to the baseband die through the TSV; and a memory die disposed on the processor die, wherein the processor die and the memory die communicate through a TSV in the processor die.

In Example 25, the subject matter of any one or more of Examples 22-25 optionally include wherein the recess is a first recess, wherein the TSV is part of a first TSV group, further including: a subsequent recess disposed in the backside surface; a subsequent recess-seated device disposed in the subsequent recess; and a subsequent TSV group in the baseband processor die that couples the baseband processor die at the active surface to the subsequent recess-seated die at the subsequent recess.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. A semiconductive device stack, comprising:
   a baseband processor die including an active surface and a backside surface;
   a recess disposed in the backside surface;
   recess-seated device disposed in the recess;
   a through-silicon via (TSV) in the baseband processor die that couples the active surface to the recess-seated die at the recess;
   a processor die disposed on the baseband processor die backside surface, wherein the processor die is coupled to the baseband die through a TSV at the backside surface;
   a memory die disposed on the processor die, wherein the processor die and the memory die communicate through a TSV in the processor die;
   a redistribution layer (RDL) disposed on the active surface;
   a ball-grid array disposed on the RDL;
   a package substrate coupled to the ball-grid array;
   wherein the recess is a first recess, wherein the TSV is part of a first TSV group;
   a subsequent recess disposed in the backside surface;
   a subsequent recess-seated device disposed in the subsequent recess; and
   a subsequent TSV group in the baseband processor die that couples the baseband processor die at the active surface to the subsequent recess-seated die at the subsequent recess.

2. A semiconductive device stack, comprising:
   a baseband processor die including an active surface and a backside surface;
   a recess disposed in the backside surface;
   recess-seated device disposed in the recess;
   a through-silicon via (TSV) in the baseband processor die that couples the active surface to the recess-seated die at the recess wherein the recess is a first recess, wherein the TSV is part of a first TSV group;
   a subsequent recess disposed in the backside surface;
   a subsequent recess-seated device disposed in the subsequent recess; and
   a subsequent TSV group in the baseband processor die that couples the baseband processor die at the active surface to the subsequent recess-seated die at the subsequent recess.

3. The semiconductive device stack of claim 2, wherein the first TSV group has a first height, the subsequent TSV group has a subsequent height, and wherein the first height and subsequent height are not equal.

4. The semiconductive device stack of claim 3, further including:
   a processor die disposed on the baseband processor die backside surface, wherein the processor die is coupled to the baseband die through the TSV; and
   wherein the TSV is part of a first TSV group, and wherein the processor die also is coupled to a first lateral TSV group that is disposed in the baseband processor die.

5. The semiconductive device stack of claim 3, further including:
   a processor die disposed on the baseband processor die backside surface, wherein the processor die is coupled to the baseband die through the TSV;
   Wherein the TSV is part of a first TSV group, and wherein the processor die also is coupled to a first lateral TSV group that is disposed in the baseband processor die; and
   a memory die disposed on the processor die, wherein the processor die and the memory die communicate through a TSV in the processor die.

6. A semiconductive device stack, comprising:
   a baseband processor die including an active surface and a backside surface;
   a recess disposed in the backside surface;
   recess-seated device disposed in the recess;
   a through-silicon via (TSV) in the baseband processor die that couples the active surface to the recess-seated die at the recess;
   a processor die disposed on the baseband processor die backside surface, wherein the processor die is coupled to the baseband die through the TSV;
   wherein the TSV is part of a first TSV group, and wherein the processor die also is coupled to a first lateral TSV group that is disposed in the baseband processor die; and
   a die disposed in the recess, wherein the die is face-to-face mounted to the processor die.

7. The semiconductive device stack of claim 6, further including
   a memory die disposed on the processor die, wherein the processor die and the memory die communicate through a TSV in the processor die.

8. A process of forming a monolithic die stack, comprising:
   forming a first recess in a baseband processor die backside surface, wherein the baseband processor die includes an active surface opposite the die backside;
   seating a first recess-seated die in the first recess, wherein the first recess-seated die is coupled to the active surface by a through-silicon via (TSV);

mounting a processor die on the baseband die backside surface, wherein the processor die is coupled to the active surface by a first lateral TSV;

mounting a memory die on the processor die, wherein the memory die is coupled to the processor die by a first processor die TSV;

forming a subsequent recess in the baseband processor die backside surface, wherein the subsequent recess and the first recess are separately formed through the baseband processor die backside surface; and seating a subsequent recess-seated die in the subsequent recess.

9. A computing system using a semiconductive device stack, comprising:

a baseband processor die including an active surface and a backside surface;

a first recess disposed in the backside surface;

first recess-seated device disposed in the first recess; and a through-silicon via (TSV) in the baseband processor die that couples the baseband processor die at the active surface to the recess-seated die at the recess;

a redistribution layer (RDL) coupled to the active surface;

an electrical bump array coupled to the RDL;

a package substrate coupled to the electrical bump array; and a physical shell coupled to the package substrate; wherein the recess is a first recess, wherein the TSV is part of a first TSV group, further including:

a subsequent recess disposed in the backside surface;

a subsequent recess-seated device disposed in the subsequent recess; and a subsequent TSV group in the baseband processor die that couples the baseband processor die at the active surface to the subsequent recess-seated die at the subsequent recess.

* * * * *

UNITED STATES PATENT AND TRADEMARK OFFICE
CERTIFICATE OF CORRECTION

PATENT NO. : 10,403,602 B2  
APPLICATION NO. : 15/637935  
DATED : September 3, 2019  
INVENTOR(S) : Waidhas et al.

Page 1 of 1

It is certified that error appears in the above-identified patent and that said Letters Patent is hereby corrected as shown below:

In the Claims

In Column 16, Line 31, in Claim 5, delete "Wherein" and insert --wherein-- therefor Signed and Sealed this  
Seventh Day of April, 2020

Andrei Iancu  
*Director of the United States Patent and Trademark Office*